(12) United States Patent
Walke et al.

(10) Patent No.: US 10,236,183 B2
(45) Date of Patent: Mar. 19, 2019

(54) MONOLITHIC INTEGRATION OF SEMICONDUCTOR MATERIALS

(71) Applicant: IMEC VZW, Leuven (BE)

(72) Inventors: Amey Mahadev Walke, Heverlee (BE); Nadine Collaert, Blanden (BE); Rita Rooyackers, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/652,786

(22) Filed: Jul. 18, 2017

(65) Prior Publication Data

US 2018/0025911 A1 Jan. 25, 2018

(30) Foreign Application Priority Data

Jul. 20, 2016 (EP) ..................... 16180388

(51) Int. Cl.
*H01L 29/778* (2006.01)
*H01L 21/762* (2006.01)
*H01L 21/18* (2006.01)
*H01L 21/02* (2006.01)
*H01L 21/768* (2006.01)
(Continued)

(52) U.S. Cl.
CPC ...... *H01L 21/187* (2013.01); *H01L 21/02387* (2013.01); *H01L 21/76251* (2013.01); *H01L 21/76895* (2013.01); *H01L 21/845* (2013.01); *H01L 23/535* (2013.01); *H01L 24/32* (2013.01); *H01L 25/0655* (2013.01); *H01L 25/50* (2013.01); *H01L 29/04* (2013.01);
(Continued)

(58) Field of Classification Search
CPC ............. H01L 21/187; H01L 21/02387; H01L 21/76895; H01L 23/535; H01L 25/0655; H01L 24/32; H01L 29/04; H01L 25/50; H01L 2224/32501; H01L 21/02293; H01L 21/02631; H01L 21/02634; H01L 21/2018; H01L 21/2022–21/2026; H01L 21/2033–21/2036; H01L 21/2085; H01L 21/2855; H01L 21/3147; H01L 21/76248; H01L 21/76262; H01L 21/76278; H01L 21/76294; H01L 21/76297; H01L 2224/81894–2224/81896; H01L 2224/83894–2224/83896; H01L 27/76251–27/76259; C30B 25/02–25/22
See application file for complete search history.

(56) References Cited

U.S. PATENT DOCUMENTS

| 2013/0228875 A1* | 9/2013 | Lee ................... H01L 29/66795 257/401 |
| 2015/0279725 A1* | 10/2015 | Waldron ........... H01L 21/76251 257/506 |

* cited by examiner

*Primary Examiner* — Marc Anthony Armand
*Assistant Examiner* — Nelson Garces
(74) *Attorney, Agent, or Firm* — McDonnell Boehnen Hulbert & Berghoff LLP (57) ABSTRACT

A method for forming a semiconductor structure by bonding a donor substrate to a carrier substrate is disclosed herein. The donor substrate may include a plurality of semiconductor layers epitaxially grown on top of one another in, and optionally above, a trench of the donor substrate. The carrier substrate may include a first semiconductor device thereon. The method may include removing at least part of the donor substrate in such a way as to expose a semiconductor layer grown on the bottom of the trench, removing at least part of the exposed semiconductor layer, thereby modifying the plurality of semiconductor layers, and forming a second semiconductor device from the modified plurality of semiconductor layers.

17 Claims, 4 Drawing Sheets

(51) Int. Cl.
*H01L 23/535* (2006.01)
*H01L 23/00* (2006.01)
*H01L 25/065* (2006.01)
*H01L 25/00* (2006.01)
*H01L 29/04* (2006.01)
*H01L 21/84* (2006.01)
*H01L 29/78* (2006.01)
H01L 23/66 (2006.01)

(52) U.S. Cl.
CPC ........ *H01L 29/778* (2013.01); *H01L 29/7851* (2013.01); *H01L 23/66* (2013.01); *H01L 2224/32501* (2013.01)

MONOLITHIC INTEGRATION OF SEMICONDUCTOR MATERIALS

CROSS-REFERENCE TO RELATED APPLICATION

The present application is a non-provisional patent application claiming priority to European Patent Application No. 16180388.7 filed Jul. 20, 2016, the contents of which are hereby incorporated by reference.

TECHNICAL FIELD

The present disclosure relates to the field of integration of further semiconductor materials and devices on (pre-processed) semiconductor substrates, and in particular to the integration of III-V materials and devices thereon.

BACKGROUND

Si MOSFETs may be suitable for analog, logic, and memory applications and may have an operating frequency up to a few 10s of GHz. Conversely, radio frequency (RF) components operating at frequencies above 100 GHz may be fabricated separately on III-V wafers, such as GaAs or InP. Sequential integration of III-V materials and devices on top of 300 mm and larger Si wafers would allow for expanding the available operating frequency on a single chip beyond 100 GHz. Furthermore, the Si wafers may be pre-processed to comprise semiconductor devices, so that different device types may be combined on a single chip. One way to achieve this monolithic integration is by bonding a III-V wafer to a Si wafer. However, these III-V wafers may only be available in a smaller size (below 300 mm) and may be very expensive.

There is thus still a need for methods of integrating semiconductor materials, and in particular III-V materials, on other substrates without the need for expensive III-V wafers.

SUMMARY OF THE DISCLOSURE

Embodiments of the present disclosure provide methods of integrating further materials on semiconductor substrates.

In some embodiments of the present disclosure, the further materials can be III-V materials.

In some embodiments of the present disclosure, expensive III-V wafers may not need to be used.

In some embodiments of the present disclosure, the substrate can have been pre-processed to comprise a first semiconductor device.

In some embodiments of the present disclosure, a second semiconductor device can be fabricated from the further materials, without degrading the first semiconductor device.

In some embodiments of the present disclosure, the vertical integration of a first and second semiconductor device may allow for a reduced amount and/or length of interconnects, as compared to a horizontal integration of both.

In some embodiments of the present disclosure, devices comprising III-V materials and devices comprising group IV materials can be integrated into a single structure.

In some embodiments of the present disclosure, the integrated further materials may have a low amount of defects, such as threading dislocations.

The above embodiments may include a method and device according to the present disclosure.

DETAILED DESCRIPTION

The present disclosure will be described with respect to particular embodiments and with reference to certain drawings but the disclosure is not limited thereto. The drawings described are only schematic and are non-limiting. In the drawings, the size of some of the elements may be exaggerated and not drawn to scale for illustrative purposes. The dimensions and the relative dimensions may not correspond to actual reductions to practice.

Furthermore, the terms first, second, third, and the like in the description and in the claims, are used for distinguishing between elements and not necessarily for describing a sequence, either temporally, spatially, in ranking, or in any other manner. It is to be understood that the terms so used are interchangeable under appropriate circumstances and that the embodiments described herein may be capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments described herein may be capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, or components, or groups thereof. Thus, the scope of the expression "a device comprising components A and B" should not be limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still cooperate or interact with each other.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various aspects of the disclosure. This method of disclosure, however, is not to be interpreted as reflecting an intention that the claims require more features than are expressly recited. Rather, as the following claims reflect, claimed embodiments may include less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

In a first aspect, the present disclosure relates to a method for forming a semiconductor structure, comprising:
(a) providing a donor substrate having a plurality of semiconductor layers epitaxially grown on top of one another, at least one semiconductor layer being present in a trench of the donor substrate, wherein the trench:
  (i) is opening toward a top of the donor substrate,
  (ii) is defined by a monocrystalline bottom and non-crystalline sidewalls, and
  (iii) has a width of from 10 nm to 10 µm;
(b) providing a carrier substrate comprising:
  (i) a semiconductor substrate at a bottom thereof,
  (ii) a first semiconductor device on the semiconductor substrate, and
  (iii) electrical contacts to the first semiconductor device, at a top of the carrier substrate;
(c) bonding the donor substrate to the carrier substrate with the top of the donor substrate and the top of the carrier substrate facing each other;
(d) removing at least part of the donor substrate in such a way as to expose a semiconductor layer grown on the monocrystalline bottom;
(e) removing at least part of the semiconductor layer grown on the monocrystalline bottom, thereby modifying the plurality of semiconductor layers; and
(f) optionally forming a second semiconductor device from the modified plurality of semiconductor layers.

In other words, the first aspect relates to a method for forming a semiconductor structure, comprising:
bonding a donor substrate, having a plurality of semiconductor layers epitaxially grown on top of one another thereon wherein at least a first of the semiconductor layers is in a trench present in the donor substrate, to a carrier substrate comprising a first semiconductor device thereon;
removing at least part of the donor substrate in such a way as to expose a semiconductor layer grown on the bottom of the trench,
removing at least part of the semiconductor layer grown on the bottom, thereby modifying the plurality of semiconductor layers; and
optionally forming a second semiconductor device from the modified plurality of semiconductor layers.

The semiconductor structure may be a structure comprising a second semiconductor device integrated on top of, e.g., at a level above, a first semiconductor device. It may be referred to as a sequentially or monolithically integrated structure. In some embodiments, the second semiconductor device on top of the first semiconductor device may overlap with that first semiconductor device, e.g., a projection of the first and of the second semiconductor device onto a same plane, perpendicular to the substrate normal, may at least partially coincide. The semiconductor structure may comprise III-V and/or group IV semiconductor materials.

The donor substrate may comprise a semiconductor substrate having a monocrystalline top surface (e.g., a monocrystalline semiconductor substrate), a non-crystalline layer overlaying the semiconductor substrate, and at least one trench in the non-crystalline layer and exposing part of the monocrystalline top surface. In an example embodiment, obtaining such a donor substrate may comprise the steps of: (a1) providing a silicon wafer, (a2) forming preliminary trenches in the silicon wafer (e.g., by using a hard mask such as a mask formed of an oxide layer and a nitride layer; the preliminary trenches may be separated from one another by an average distance of from 10 nm to 10 µm), (a3) filling the preliminary trenches with an oxide (e.g., silicon dioxide) in such a way that the top surface of the oxide is co-planar with the top surface of the silicon wafer (this can, for instance, be achieved by overfilling the preliminary trenches with the oxide, followed by performing a chemical mechanical planarization (CMP) step and removing the hard mask), (a4) forming (final) trenches by etching through the silicon wafer exposed between the oxide filling (this can, for instance, be performed by using tetramethylammonium hydroxide (TMAH), NaOH, or KOH, which leads to the formation of V-shaped final trenches having exposed {111} planes), thereby forming trenches opening toward a top of the donor substrate, defined by a Si monocrystalline bottom and oxide non-crystalline sidewalls. The final trenches may have an average width of from 10 nm to 10 μm.

The monocrystalline top surface of the semiconductor substrate may comprise the monocrystalline bottom of the trench. In some embodiments, the semiconductor substrate may comprise one or more group IV or III-V materials. For example, the semiconductor substrate may be a Si, Ge, GaAs, or InP substrate, or an on-insulator type substrate such as an Si-on-insulator or a Ge-on-insulator substrate. In some embodiments, the semiconductor substrate may be made of a group IV material. For instance, it may be made of Si. The trench may extend upward from the semiconductor substrate through a non-crystalline material present on the monocrystalline surface. The non-crystalline material may, for example, be part of a shallow trench isolation (STI). Growing at least one (first) semiconductor layer inside the trench may limit the area over which a uniform layer may need to be grown and thus may limit the appearance of defects in the layer. In embodiments, the trench may have a length of from 1 μm to 1 mm. The length of the trench may be larger than the width of the trench. The trench may have a uniform shape along its length. In particular, the vertical cross-section of the trench taken perpendicularly to the longitudinal direction of the trench may be the same all along the length of the trench. Further, the height of the trench may be uniform along its length. Also, if more than one trench is made, e.g., for the purpose of forming more than one second semiconductor device, the trenches may all have the same or substantially the same vertical cross-section taken perpendicularly to the longitudinal direction of the trench. In embodiments where filling the trenches comprises a step in which a semiconductor layer (e.g., the first semiconductor layer) forms an overburden above the trench, the overburden may be similar for the different trenches when the trenches have the same vertical cross-section, thus simplifying a subsequent removal of the overburden (e.g., through CMP). In other embodiments where the plurality of semiconductor layers does not extend above the top of the trench, trenches having the same vertical cross-section may enable, for instance, stopping a subsequent CMP step within or at the same layer for each plurality of layers in each trench. This issue may be addressed by using a wide-field approach where a single wide trench is used and where the plurality of layers is patterned into separate devices after growth. In some embodiments, the trench may have a depth to width aspect ratio of 1.42:1 or larger and, in some embodiments, 2:1 or larger. A trench of this first type may have a width of 10 nm to 100 nm and may be referred to as an aspect ratio trapping (ART) trench. In other embodiments, the trench may have a depth to width aspect ratio smaller than 2:1 and, in some embodiments, smaller than 1.42:1 (e.g., from 1.41:1 to 0.1:1 or from 1.41:1 to 0.5:1). A trench of this second type may have a width of 200 nm to 5 μm and may be referred to as a wide field trench. A wide field trench may allow for a less critical alignment of the carrier and the donor substrates during bonding. Furthermore, it may allow a plurality of second semiconductor devices to be formed from a single plurality of multilayers in a trench.

In some embodiments, the trench may comprise a bottom portion, e.g., a portion of the trench at its lower end, having a vertical cross-section having a V-shape. The V-shape may be oriented such that the trench tapers towards its bottom. In other embodiments, the vertical cross section may have another tapered shape. In some embodiments, the vertical cross-section may be taken perpendicularly to the longitudinal direction of the trench. In some embodiments, a bottom portion of the trench may be defined by two crystalline planes having Miller indices {111}. In particular, it may have a vertical cross-section having a V-shape and be defined by two crystalline planes having Miller indices {111}. The trench as such and the shape and crystal orientation of the bottom portion may hinder threading dislocations and other crystal defects in the semiconductor layers, which may arise from a lattice mismatch between a semiconductor layer and the surface it is epitaxially grown on (e.g., between a first semiconductor layer grown on the semiconductor bottom on one hand and the monocrystalline bottom on another hand), from propagating upwards and into further semiconductor layers. When the semiconductor bottom is Si, in order to form a bottom portion defined by two crystalline planes having Miller indices {111}, the Si present between the non-crystalline sidewalls can be selectively etched by, e.g., using a KOH or NaOH solution.

In some embodiments, the plurality of semiconductor layers may comprise one or more layers of III-V materials. In some embodiments, the plurality of semiconductor layers may be two or more layers of III-V materials. In some embodiments, at least one of the one or more layers of III-V materials may be selected from InP, InAlAs, InGaAs, InAs, GaAs, InGaSb, GaSb, InGaP, AlGaAs, and InGaAlP. In some embodiments, the plurality of semiconductor materials may be grown in an order (before bonding) that is reverse to an order in which they will appear in the second semiconductor device (after bonding).

The first layer of the plurality of layers may be a buffer layer having a thickness (e.g., height) of from 100 to 500 nm. This may be much less than the buffer layer used for blanket growth of a III-V buffer on a Si substrate.

The buffer layer may, for instance, be made of InP. The buffer layer may either have the same lattice constant as the surface present at the bottom of the trench, or may have a different lattice constant. In this latter case, the buffer may be strained at the bottom of the trench and may relax towards the top of the trench. In some embodiments, the buffer layer may have the same lattice constant as the surface present at the bottom of the trench. When the first layer is a buffer layer (e.g., InP), the second layer grown on top of the buffer layer may be a junction layer, also called a cap layer. This layer may ensure a good contact with the metal that will serve to interconnect the device in the final semiconductor structure according to an embodiment of the present disclosure. This may therefore be a doped semiconductor layer such as an n-doped InGaAs layer. The third layer may be an etch stop layer. This layer can be, for instance, an InP layer. It may permit protecting the next layer during step (e) where some etching steps are often involved. Depending on the type of second semiconductor device formed, the fourth layer can be a layer of channel material or it can be a barrier/spacer layer.

In some embodiments, the plurality of semiconductor layers may extend above the top of the trench. This may be achieved by growing at least one semiconductor layer inside the trench and, after filling the trench therewith, and perhaps after a CMP step making the top of the trench filling coincide with the top of the trench, further growing one or more further semiconductor layers above the trench filling. In such a case, any further semiconductor layer may use the layer it is grown on as a seed layer, thereby limiting the area over which uniform layers need to be grown. For instance, each of the further semiconductor layers may have a horizontal cross-section substantially equal in shape and dimensions to the top surface of the semiconductor layer on which it is epitaxially grown.

In some embodiments, the first semiconductor layer may completely fill the trench, and the further semiconductor layer(s) may be grown on the first semiconductor layer.

In other embodiments, the top surface of the plurality of semiconductor layers may be coplanar with the top surface of the donor substrate, e.g., the plurality of semiconductor layers may be completely within the trench.

In some embodiments, at least one of the plurality of semiconductor layers may have a top surface substantially free of threading dislocations, e.g., comprising less than $10^8$ threading dislocations per $cm^2$. In some embodiments, the semiconductor layer grown on the monocrystalline bottom may have a top surface comprising less than $10^8$ threading dislocations per $cm^2$. A semiconductor layer that is substantially free of defects may be obtained when growing the layer over a limited area in a trench, particularly when combined with a trench shape that promotes aspect ratio trapping (e.g., when the first semiconductor layer is epitaxially grown on the monocrystalline bottom) and/or when a semiconductor layer is epitaxially grown on a sufficiently defect free layer with which it has only a limited lattice mismatch (e.g., when a further semiconductor layer is grown on the first semiconductor layer, the first semiconductor layer being sufficiently free of defects and matching the lattice constant of the further layer). In some embodiments, defects, such as threading dislocations, may also be reduced by annealing at least one of the plurality of semiconductor layers, such as the buffer layer (e.g., the first semiconductor layer). This may be relevant when a wide field trench is used. In embodiments where upon growing the first semiconductor layer in the trench, it overfills the trench, an annealing step may be performed before a planarization (e.g., CMP) step. In some embodiments, a layer of the plurality of semiconductor layers may be annealed prior to growing a further layer thereon. Annealing may be performed when the trench has a depth to width aspect ratio smaller than 2:1, such as smaller than 1.42:1. Such an annealing may cause some of the eventually remaining threading dislocations to migrate toward the sidewalls where they can be trapped, thereby decreasing the threading dislocation density of the top surface. This annealing step can be dispensed of for trenches having an aspect ratio of 2:1 or more, or even 1.42:1 or more.

The carrier substrate may comprise a semiconductor substrate, a first (pre-processed) semiconductor device thereon, and electrical contacts to the first semiconductor device. Expressed differently, the carrier substrate may comprise a semiconductor substrate, a front-end-of-line (FEOL), and a back-end-of-line (BEOL). The material used for the semiconductor substrate comprised in the carrier substrate may be any of the material described as being suitable for the semiconductor substrate that may be comprised in the donor substrate. The material used in each of these semiconductor substrates may be independently selected. Silicon may be used, for example, as it is relatively inexpensive and will ultimately be sacrificed. The first semiconductor device may, for example, be a transistor or a memory device. The electrical contacts may allow the device to be operated.

Bonding the donor substrate to the carrier substrate may allow the two to be integrated into a single bonded structure. In some embodiments, the donor substrate and carrier substrate may be aligned, during bonding, such that the trench in the donor substrate overlaps the first semiconductor device in the carrier substrate. In some embodiments, the method may further comprise a step (b'), before step (c), of providing a bonding layer on top of the donor substrate, the carrier substrate, or both. The material of each bonding layer may be independently selected. In some embodiments, each bonding layer may be a dielectric layer. A dielectric bonding layer may provide electrical isolation between the donor and carrier substrate. In some embodiments, each bonding layer may comprise an oxide (e.g., $SiO_2$) or a carbide-nitride (e.g., SiCN). In some embodiments, the dielectric bonding layer(s) may be selectively etchable with respect to the non-crystalline material of the non-crystalline sidewalls. For instance, the dielectric bonding layer may be a carbide-nitride (e.g., SiCN) layer, while the non-crystalline material of the non-crystalline sidewalls may be an oxide (e.g., $SiO_2$). For the formation of a high electron mobility transistor (HEMT), a high band-gap material may be used between the wafer (e.g., InP or GaAs) and the channel. In embodiments of the present disclosure where a bonding layer is present, a further high band-gap material may not be necessary. After the provision of the bonding layers, a planarization step (e.g., CMP) of these bonding layers may be performed to facilitate bonding.

In step (d), removing at least part of the donor substrate may, for example, be performed by using an ion cut technique, also known as Smart Cut, backside grinding, and/or (wet or dry) etching.

In step (d), at least part of the donor substrate may be removed. The donor substrate may be formed of a semiconductor wafer and non-crystalline sidewalls (e.g., STIs), which together define one or more trenches. The part of the donor substrate that may be removed is the semiconductor wafer. This can be achieved by first removing a large portion of it by grinding or cutting, followed by a selective removal of the remainder of it. This selective removal can be achieved by using tetramethylammonium hydroxide if the semiconductor wafer is silicon.

In step (e), removing at least part of the (first) semiconductor layer grown on the monocrystalline bottom may comprise an etching of the semiconductor layer. The removed part of the semiconductor layer may be a part comprising the entirety of the interface between the first semiconductor layer and the monocrystalline bottom. The removed part of the first semiconductor layer may comprise at least the first portion of the first semiconductor layer comprising a majority (and perhaps substantially all) of the threading dislocations, as well as other crystal defects, such that the remainder of the semiconductor layers after removal may be low in threading dislocations (and perhaps substantially free of threading dislocations). In some embodiments, removing at least part of the first semiconductor layer grown on the monocrystalline bottom may be accompanied by removing at least part of the non-crystalline sidewalls. In some embodiments, the complete first layer may be removed.

Once the semiconductor wafer of the donor semiconductor substrate has been removed in step (d), all or part of the non-crystalline material forming the side-walls (e.g., an oxide such as $SiO_2$ provided as STIs) and optionally part of the bonding layer may also be removed. For instance, particularly when the plurality of semiconductor layers does not extend above the top of the trench, part of the STIs may be removed by CMP. The CMP step may be continued in step (e) until part or all of the first semiconductor layer is removed as well. When only part of the first semiconductor layer is removed, it is the part that contacts the bottom of the trench and that is therefore the richest in defects that is removed. The CMP may be performed in such a way that the first semiconductor layer and the STI are polished at the same rate. Once (at least) that defective part has been removed, the remaining of the STI may optionally be removed as well. In another instance, particularly when the first epitaxial (buffer) layer fills the trench and the rest of the plurality of semiconductor layers extends above the top of the trench, all of STIs may be removed. This can be done by CMP, thereby simultaneously removing the first (buffer) semiconductor layer. This can also be done by removing the STI selectively towards the bonding layer (e.g., by etching), followed by removing selectively (for instance, by etching) the first (buffer) semiconductor layer, thereby exposing the second grown semiconductor layer, and optionally removing part of the bonding layer. In some embodiments, when more than one trench and more than one plurality of semiconductor layers were grown on the carrier substrate, part of the bonding layer between two modified pluralities of semiconductor layers may optionally be removed. Removing the remaining STI or part of the bonding layer may not always be necessary because the isolation provided by either may be a desired feature. However, if, for instance, an isolation of a different quality is desired, the remaining STI or part of the bonding layer can indeed be removed and eventually replaced by the isolation of a different quality.

Forming a second semiconductor device from the plurality of semiconductor layers may comprise removing, such as etching, part of the plurality of semiconductor layers and/or forming additional device features, such as a gate, source, drain, and contacts. In some embodiments, step (f) may comprise patterning the modified plurality of semiconductor layers to form at least one second semiconductor device. In some embodiments, step (f) may comprise at least partially or completely removing the non-crystalline sidewalls. The vertical integration of a second semiconductor device on top of a first semiconductor device may allow for a reduced amount and/or length of interconnects, as compared to a structure where both are horizontally integrated. In some embodiments, two or more second semiconductor devices may be formed from the plurality of semiconductor layers.

In some embodiments, the first semiconductor device may be a complementary metal-oxide-semiconductor (CMOS) device, and the second semiconductor device may be a radio-frequency (RF) device. In some embodiments, the second semiconductor device may comprise a high-electron-mobility transistor or a metal-oxide-semiconductor field-effect transistor. The independent selection of materials in the first and second semiconductor device may enable different device types to be combined in the same structure. In particular, embodiments of the present disclosure may allow a device suitable for radio-frequency operation and a lower frequency CMOS device to be combined on a single chip, e.g., in a single structure.

In some embodiments of the first aspect, the present disclosure may relate to a method for forming a semiconductor structure, comprising:
(a1) providing a silicon wafer,
(a2) forming preliminary trenches in the silicon wafer (e.g., by using a hard mask such as a mask formed of an oxide layer and a nitride layer; the preliminary trenches may be separated from one another by an average distance of from 10 nm to 10 µm),
(a3) filling the preliminary trenches with an oxide (e.g., silicon dioxide) in such a way that the top surface of the oxide is co-planar with the top surface of the silicon wafer (this can, for instance, be achieved by overfilling the preliminary trenches with the oxide, followed by performing a CMP step and removing the hard mask),
(a4) forming final trenches by etching through the silicon wafer exposed between the oxide filling (this can, for instance, be performed by using a tetramethylammonium hydroxide (TMAH) solution, a NaOH solution, or a KOH solution, which leads to the formation of V-shaped final trenches having exposed {111} planes), thereby forming trenches opening toward a top of the donor substrate, defined by a Si monocrystalline bottom and oxide non-crystalline sidewalls (the final trenches may have an average width of from 10 nm to 10 µm),
(a5) growing a first semiconductor layer (e.g., a III-V material such as InP) in the final trenches (this may be done by letting the first semiconductor layer overgrow the final trenches, followed by an optional annealing step to increase defect trapping at the sidewalls, followed by a CMP step to obtain a flat surface for the top of the first semiconductor layer coinciding with the top of the final trench),
(a6) growing the further semiconductor layer(s) on the first semiconductor layer in order to form the plurality of semiconductor layers,
(b) providing a carrier substrate comprising:
(i) a Si wafer at a bottom thereof,
(ii) a first semiconductor device on the semiconductor substrate (e.g., a FEOL), and
(iii) electrical contacts to the first semiconductor device, at a top of the carrier substrate (e.g., a BEOL),
(b'1) depositing a bonding dielectric layer on top of the carrier substrate and on top of the donor substrate (this bonding dielectric may be selected in such a way that it can be preserved upon selective etching of the oxide filling the preliminary trenches and forming the sidewalls of the final trenches; this selectivity may preserve isolation of the host wafer after bonding, which may save process steps in some embodiments),
(b'2) performing a planarization step of the bonding layers (e.g., by CMP; this planarization may facilitate bonding),
(c) bonding the donor substrate to the carrier substrate with the top of the donor substrate and the top of the carrier substrate facing each other (in this step, the bonding layers are bonded to each other),
(d) removing the Si wafer (this can be, for instance, performed by Smart Cut or by grinding combined with CMP followed by dry or wet etching),
(e) removing the oxide selectively with respect to the bonding dielectric and removing the first semiconductor layer selectively with respect to the other semiconductor layers of the plurality of semiconductor layers, thereby exposing the remaining semiconductor layer(s) and forming a modified plurality of semiconductor layers, and
(f) optionally forming a second semiconductor device from the modified plurality of semiconductor layers.

Each step of this embodiment can be used in replacement to a corresponding step in any embodiment of the first aspect.

In some embodiments, after step (e), the modified plurality of semiconductor layers may comprise:
(i) a channel layer on top of the bonding layer;
(ii) a spacer layer on top of the channel layer and a barrier layer thereon, the spacer and barrier layer separated by a delta doping layer;

(iii) an etch stop layer on top of the barrier layer; and
(iv) a capping layer on top of the etch stop layer; (see, e.g., FIGS. 3 to 5)

or the modified plurality of semiconductor layers may comprise:
(i) a barrier layer on top of the bonding layer and a spacer layer thereon, the barrier and spacer layer separated by a delta doping layer;
(ii) a channel layer on top of the spacer layer;
(iii) an etch stop layer on top of the channel layer; and
(iv) a capping layer on top of the etch stop layer; (see, e.g., FIG. 6)

or the modified plurality of semiconductor layers may comprise:
(i) a channel layer on top of the bonding layer, a delta doping layer present therein;
(ii) an etch stop layer on top of the channel layer; and
(iii) a capping layer on top of the etch stop layer; (see, e.g., FIG. 7)

and step (f) may comprise:
(f1) providing a contact layer on top of the capping layer,
(f2) opening a window in the contact layer, extending from the contact layer to the etch stop layer, thereby exposing the barrier layer or the channel layer;
(f3) providing a gate (e.g., by deposition of a metal followed by patterning and etching);
(f4) providing a gate isolation (e.g., by depositing an oxide layer embedding the gate, followed by planarization by CMP, deposition of an etch stop layer, deposition of an oxide layer on the etch stop layer, and opening a window where the contacts are to be formed); and
(f5) providing a gate contact, a source contact, and/or a drain contact.

The capping layer may, for instance, be an InGaAs layer.

The contact layer may, for instance, be a metal layer, such as a molybdenum layer.

Step (f2) can, for instance, be performed by forming a mask by lithography followed by etching of the contact layer and of the capping layer from the gate region.

Step (f5) can, for instance, be performed by a damascene process.

In some embodiments, the gate may be a T-shaped gate. For RF applications, very low resistance and capacitance may be required. It may therefore be desirable to have very low resistance for the gate. A T-shaped gate may permit this. To this effect, an opened window can be filled with gate material, followed by a CMP. Then windows may be opened for the contacts. The T shape is used to reduce the resistance of the gate. Since these RF circuit transistors can be quite wide (long channel), resistance of the gate can be very high. This T shape may thus be suited for RF transistors, as the horizontal bar of the T provides a region of lower resistance. The present flow may permit the use of different metals for contacting the gate on one hand and the source/drain on the other. This can have an impact on the contact resistance of the III-V material. Gate and source/drain can be separately optimized.

The best metal to use on the source/drain (S/D) may not necessarily be the best material to use for the gate on the InAlAs barrier. The gate material on the barrier may be selected such that it provides minimum leakage through the gate and at the same time sets an appropriate threshold voltage of the transistor. In some embodiments, the gate isolation may be an oxide, a nitride, and/or an air gap. In some embodiments, the gate, the gate contact, the source contact, and/or the drain contact may, independently, comprise one or more materials, such as one or more metals. In some embodiments, the plurality of semiconductor layers may comprise a layer of channel material, e.g., a layer of material suitable to form a channel in a field-effect-transistor, and step (c) may form a bonded structure where one of the bonding layers is directly in contact with the layer of channel material. Particularly when the bonding layers are insulating layers, such as dielectric layers, the layer of channel material may be directly in contact with a bonding layer, dispensing with the need for any additional layers in between both.

In some embodiments, a delta doping monolayer may be present within one of the plurality of semiconductor layers. In some embodiments, the delta doping monolayer may be present away from the center of the thickness of the layer of channel material.

A delta doping layer may permit providing carriers to the channel and below spacers and below the n+ layer of the contacts.

In some embodiments, during or after step (c), the carrier substrate may be kept at temperatures not exceeding 500° C. Embodiments of the present disclosure may allow the second semiconductor device to be formed without exposing the carrier substrate to high temperatures during or after the bonding. Not exposing the carrier substrate to these high temperatures may allow any first semiconductor devices therein to not deteriorate and thus to remain functional.

In a second aspect, the present disclosure relates to a semiconductor device, comprising:
(i) a semiconductor wafer;
(ii) a first semiconductor device on the semiconductor wafer, the first semiconductor device comprising one or more group IV semiconductors,
(iii) electrical contacts to the first semiconductor device, and
(iv) a second semiconductor device bonded on top of the first semiconductor device, the second semiconductor device comprising one or more III-V materials.

In some embodiments, the second semiconductor device may be overlapping the first semiconductor device.

The semiconductor structure of the second aspect may be in accordance with the semiconductor structure of the first aspect and its embodiments. In particular, the semiconductor wafer, first and second semiconductor device, and electrical contacts may independently be as described with respect to the first aspect and its embodiments.

The disclosure will now include a detailed description of several example embodiments. It is clear that other embodiments of the disclosure can be configured without departing from the true technical teaching of the disclosure, the disclosure being limited only by the terms of the appended claims.

Reference will be made to transistors. These are three-terminal devices having a first main electrode such as a drain, a second main electrode such as a source, and a control electrode such as a gate for controlling the flow of electrical charges between the first and second main electrodes.

It will understood that the present disclosure is also applicable to similar devices that can be configured in any transistor technology, including for example, but not limited to, CMOS, BICMOS, Bipolar, and SiGe BICMOS technology.

Example 1: Fabrication and Bonding of Substrates in Accordance with the Present Disclosure Referring to FIG. 1, in step (a), a donor substrate 100, e.g., comprising a Si wafer, is provided. The donor substrate 100 may have a plurality of trenches 300 therein. The donor substrate 100 may have a plurality of semiconductor layers 200 epitaxially grown thereon. Furthermore, the donor substrate 100 may comprise a shallow trench isolation (STI), e.g., in silicon oxide. In this manner, each trench 300 may be defined by a monocrystalline bottom 310 and non-crystalline sidewalls 320. The plurality of semiconductor layers 200, e.g., layers of III-V materials, may be epitaxially grown in and extending above the trenches 300. To obtain this plurality of semiconductor layers 200, for instance, a buffer layer filling each trench and forming an overburden can first be grown. Subsequently, an annealing step to move the defects towards the non-crystalline sidewalls 320 may be performed. Next, a chemical-mechanical polish (CMP) to remove the overburden can be performed. Finally, further semiconductor layers may be grown on the buffer layer.

Figure 1:
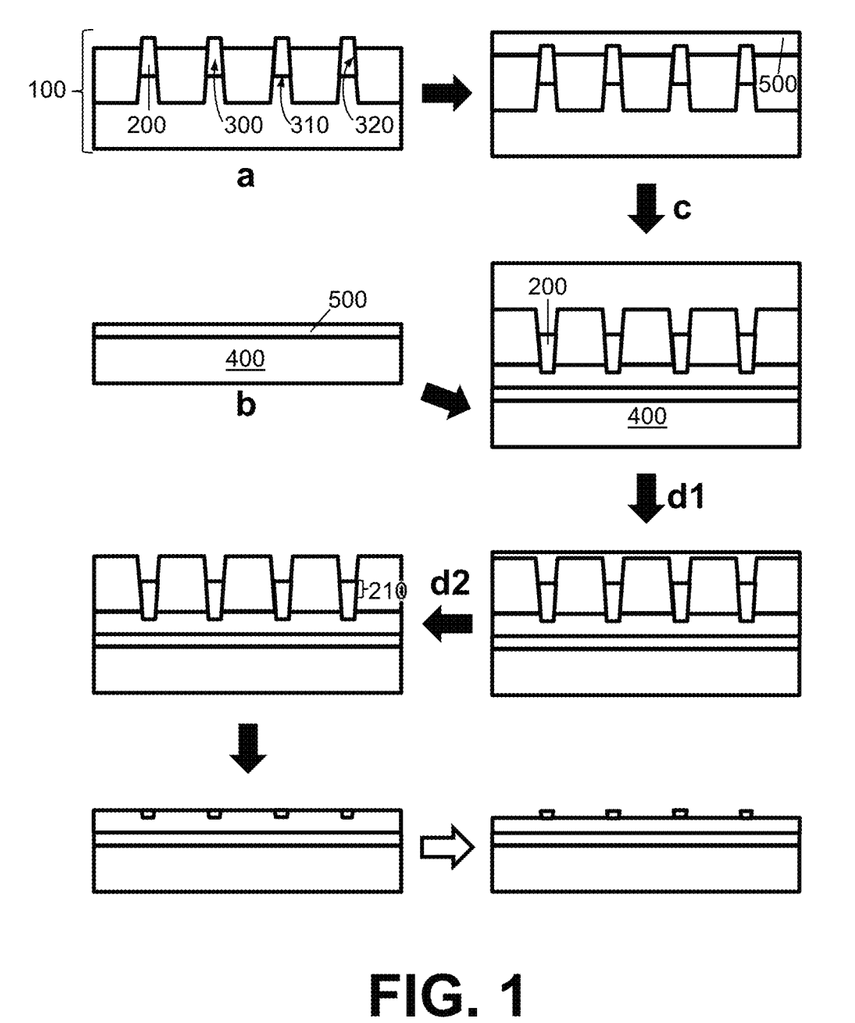
FIG. 1 shows a process of fabricating and bonding substrates, according to an example embodiment.

In a next step, the structure may be covered with a bonding layer 500, e.g., a bonding oxide.

In step (b), a carrier substrate 400 is provided and may comprise a first semiconductor device (not shown) on a semiconductor substrate and electrical contacts (not shown) thereto. The carrier substrate 400 may also be covered with a bonding layer 500 in a subsequent step, e.g., a bonding oxide.

In step (c), the donor substrate 100 may be flipped and bonded to the carrier substrate 400 by joining both bonding layers 500.

In step (d1), the donor substrate 100 may be partially removed, e.g., by a Smart Cut technique. For instance, a top portion of the Si wafer can be removed if present.

In step (d2), a further crystalline portion of the donor substrate 100 (e.g., the rest of the Si wafer if present) may be removed selectively by etching down to a first semiconductor layer 210, which was grown on the monocrystalline bottom 310.

In step (e), the shallow trench isolation may be removed selectively with respect to the bonding layer 500; and the first semiconductor layer 210, comprising the threading dislocations, may be etched back selectively with respect to the rest of the plurality of layers 200.

As shown at the bottom left of FIG. 1, the full bonding layer may be preserved and may act as an isolation between several modified plurality of semiconductor layers 200.

As shown at the bottom right of FIG. 1, optionally, part of the bonding layer may be removed.

The remainder of the plurality of semiconductor layers 200 can then be further processed to form second semiconductor devices; e.g., see example 3 below.

Figure 2:
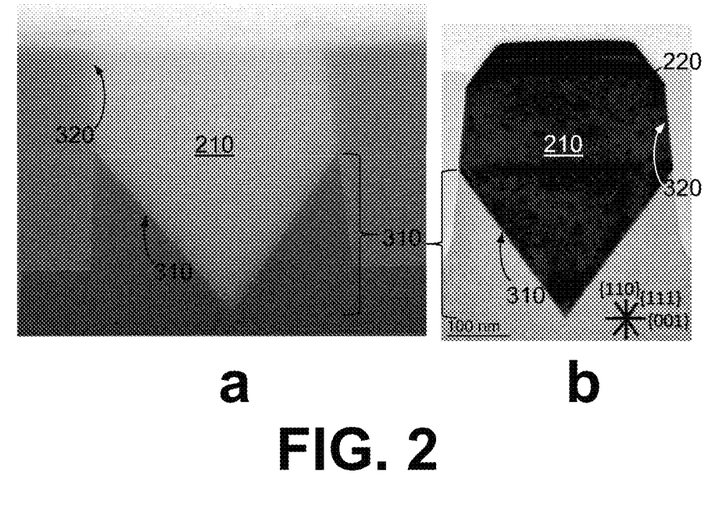
FIG. 2 shows electron microscope images of layers of semiconductor material grown in a trench having a V-shaped bottom, according to an example embodiment.

Example 2: Epitaxial Growth of Semiconductor Layers in a Trench Having a V-Shaped Bottom Portion Referring to FIG. 2, electron microscope images show the growth of an InP first semiconductor layer 210 (FIG. 2a) and InGaAs 220 on InP 210 semiconductor layers (FIG. 2b) in a trench having a V-shaped bottom portion. For both images, the V-shape coincides with the Si crystalline bottom 310 having corresponding Miller indices {111} and promotes the extinction of threading dislocations in the first semiconductor layer 210, so that they do not propagate into further semiconductor layers 220. The trench may be further confined by the STI non-crystalline sidewalls 320.

Figure 3:
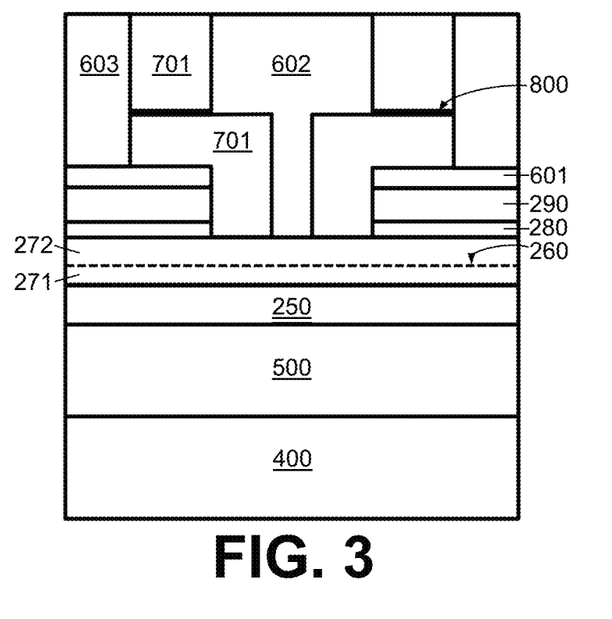
FIG. 3 shows a schematic representation of a cross-section of a semiconductor device that may be formed, according to an example embodiment.
Figure 4:
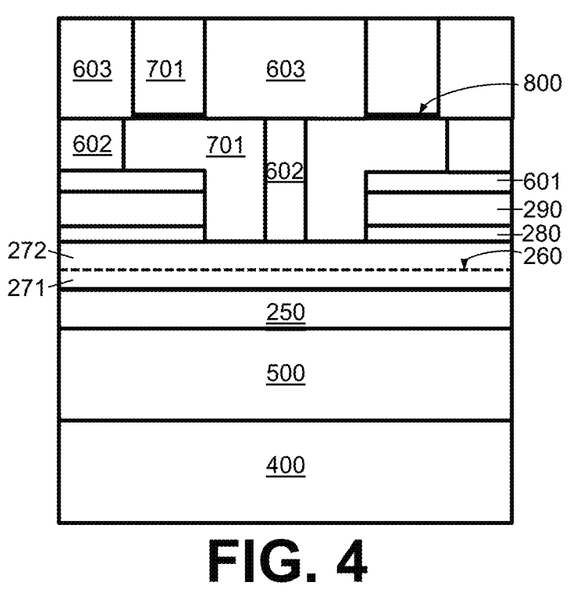
FIG. 4 shows a schematic representation of a cross-section of a semiconductor device that may be formed, according to an example embodiment.
Figure 5:
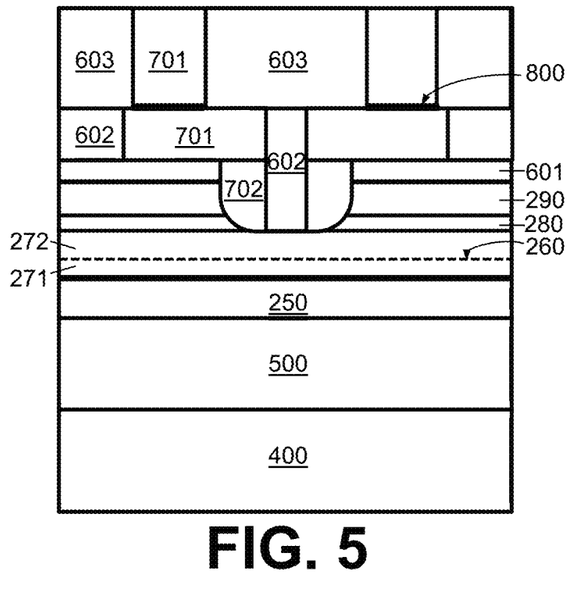
FIG. 5 shows a schematic representation of a cross-section of a semiconductor device that may be formed, according to an example embodiment.
Figure 6:
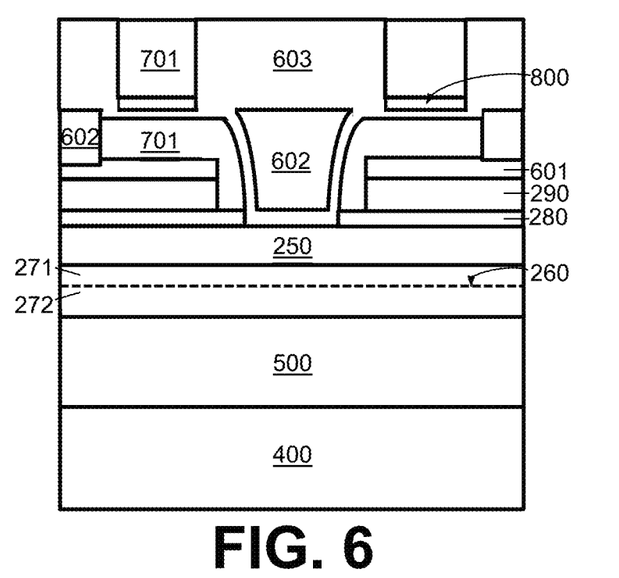
FIG. 6 shows a schematic representation of a cross-section of a semiconductor device that may be formed, according to an example embodiment.
Figure 7:
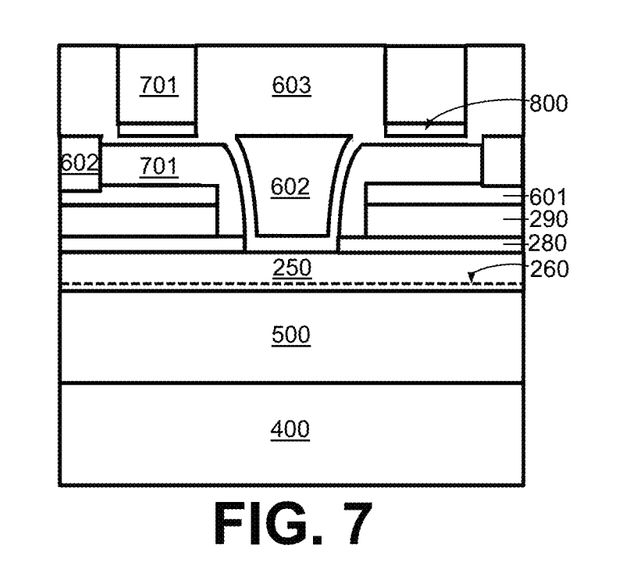
FIG. 7 shows a schematic representation of a cross-section of a semiconductor device that may be formed, according to an example embodiment.

Example 3: Different Second Semiconductor Devices Based on Different Integration Schemes Different second semiconductor devices can be made out of the remainder of the plurality of semiconductor layers 200, depending on the integration scheme used; a few possibilities are depicted in FIGS. 3 to 7. FIGS. 3 to 5 show variations of a high-electron mobility transistor (HEMT) second semiconductor device, whereas FIGS. 6 to 7 show variations of a metal-oxide-semiconductor field-effect transistor (MOSFET) second semiconductor device.

Referring to FIG. 3, bonded to the carrier wafer 400, which comprises first semiconductor devices (not shown), through the bonding layer(s) 500 (e.g., 150-1000 nm) is a plurality of semiconductor layers 250, 260, 280, 290. The plurality of semiconductor layers may comprise a thick layer of InGaAs channel material 250 (e.g., 5-12 nm) directly in contact with the bonding layer(s) 500; an InAlAs spacer 271 (e.g., 2-4 nm, such as 3 nm) and an InAlAs barrier 272 (e.g., 7-15 nm) layer thereon, comprising a Si delta doping monolayer 260; a 2-3 nm thick InP etch stop layer 280; and a 5-70 nm n++ InGaAs capping layer 290.

Molybdenum contacts 601 may cover the capping layer 290. A window to the InAlAs barrier 272 may be opened in the contact(s) 601, capping layer 290, and etch stop layer 280, and a T-shaped gate contact in a second metal 602 may be made. Source and drain contacts in a third metal 603 to the molybdenum contacts 601 may be provided. The source, drain and gate contacts may be isolated from one another by an oxide 701, which may comprise an etch stop layer 800. This structure may be formed as follows.

To form this structure, molybdenum may be deposited on the InGaAs capping layer 290. Molybdenum may then be removed from the gate region, thereby opening a window. For this purpose, lithography and etching may remove molybdenum and InGaAs from the gate region. The vertical bar of the T-shaped gate may be formed by deposition, patterning, and etching, and an oxide layer may then be deposited to embed the vertical bar of the T-shaped gate. The structure may then be planarized by CMP, and an etch stop layer may be deposited. Then, an oxide may be deposited on the etch stop layer, and a window corresponding to the horizontal bar of the T-shaped gate may be opened in the oxide. Then, by a damascene process, the metal for the horizontal bar of the T-shaped gate may be deposited. For RF applications, very low resistance and capacitance are required. Therefore, very low resistance may be needed for the gate. As such, a T-shaped gate may be used. Then, windows may be opened for the source and drain contacts. The T shape may be used to reduce the resistance of the gate. Since these RF circuit transistors can be quite wide (long channel), resistance of the gate can be very high. This T shape may thus be suited for RF transistors. The horizontal bar of the T is a region of lower resistance. The present flow may permit the use of different metals for contacting the gate on one hand and the source/drain on the other. This can have an impact on the contact resistance of the III-V material. The gate and source/drain can be separately optimized.

The metal used on the molybdenum S/D may not necessarily be the same material used for the gate on the InAlAs barrier.

Referring to FIG. 4, starting from a same plurality of III-V semiconducting layers 250, 260, 280, 290, a different flow may lead to a similar HEMT device, differing in that the source, drain, and gate contacts may all comprise a bottom portion in a second metal 602 and a top portion in a third metal 603.

For this purpose, a window may be opened like in the example of FIG. 3. Then, an oxide may be deposited, CMP may be performed, and windows may be opened for the gate and source/drain (S/D) simultaneously in a single step. Then, the windows may be filled with a metal and CMP may be performed. This method may be one step shorter than the flow used for the structure of FIG. 3. In the next step, an etch stop layer (SiN) may be deposited, which can resist etching in conditions where silicon oxide would not. Then, a layer of oxide may be deposited, and a window may be opened for the horizontal bar of the T-shaped gate. A different metal can be chosen for the head of the gate than for the bottom part of the gate. The same is true for the source/drain regions. The S/D can be opened together with the gate because a gate dielectric is not used for an HEMT. For an HEMT, there is a Schottky contact between the gate and the InAlAs. For a MOSFET flow, a gate dielectric is used, so the S/D areas may be opened after the gate oxide is deposited. In scenarios involving an HEMT, molybdenum may be used over the InGaAs for improved contact in the S/D regions, and in order to prevent too much current from flowing from gate to channel, the gate may be placed directly in contact with the InAlAs barrier. The InAlAs barrier may not allow too much current to flow to the gate. For the horizontal bar of the T-shaped gate, copper or tungsten may be used, for instance.

Referring to FIG. 5, again starting from the same plurality of III-V layers 250, 260, 280, 290, a different flow may lead to a similar HEMT device; here, electrical isolation of the gate contact may be partially provided by air gaps 702.

In a self-aligned flow, molybdenum (Mo) may be deposited on the InGaAs capping layer, and an oxide may then be deposited thereon. A window may then be opened in the oxide by dry etching, and the Mo and the n+ InGaAs may then be etched by wet etching, thereby forming a wider window in the Mo and InGaAs than in the oxide. Windows may then be opened in the oxide for the S/D contacts. Then, the etch stop part of the etch stop layer may be etched anisotropically to expose the part of the InAlAs barrier that is overlapping with the opening formed in the oxide. Then, metal may be deposited, and CMP may be performed. Because this flow is self-aligned, access resistance for the source and drain may be the same. In the previous flows leading to FIG. 3 or 4, if alignment is not perfect, the access resistance may be different for the source and the drain. Speed depends on both resistance and capacitance. Resistance is determined by the length of the channel. In FIG. 3 or 4, the capacitance may be made smaller on the drain side by placing the horizontal bar of the T-shaped gate asymmetrically. This may help to improve performance. So forming the T-shaped gate in two steps may permit placing the head of the T-shaped gate asymmetrically and may thereby reduce the capacitance of the drain. It is also possible to shift the gate closer to the source than to the drain so as to reduce the capacitance. However, the self-aligned concept may be more reliable. Alignment can be difficult, and improper alignment can cause the opposite asymmetry as desired. In this process flow leading to FIG. 5, the distance between the source and the gate and the distance between the gate and the drain may be defined by a single lithography step not requiring alignment. In FIGS. 3 and 4, there may be two lithographic steps, one to open the first window in the Mo and the n+ InGaAs, and one to open the gate in the oxide. This may increase a risk of misalignment. In FIG. 5, the dielectric constant of air being 1, the air gaps may reduce the capacitance. In FIG. 4, oxide is present instead of air, so the capacitance may be nine times higher.

Referring to FIG. 6, in contrast with the HEMT device, the order of the channel 250, spacer 271, delta doping 260, and barrier 272 layers may be reversed in this MOSFET device. Furthermore, a wider gate contact 602, 603 may be provided.

Here, the device may have a gate dielectric, and there may be a small difference in the stack. This again may be a self-aligned gate. As described above, in HEMT, the InAlAs layer may be between InP and InGaAs, but for MOSFET the InGaAs and InAlAs layers may be switched so that the InAlAs layer is on the bonding layer. The InAlAs may serve as a carrier supply layer for the channel. To this effect, it may comprise a delta doping layer. This may reduce the access resistance of the source and drain. InAlAs (or InP) is a high band gap material, and InGaAs is a low band gap material. Furthermore, the electron affinity of the InGaAs is higher than InAlAs (or InP). Therefore, electrons in delta doped InAlAs (or InP) will fall in the channel. Current flows in the region that is undoped, where mobility is higher. The distance between the delta doping and the channel may be 2-3 nm. A molybdenum layer may be provided on the InGaAs capping layer, an oxide may be deposited on the molybdenum layer, and a window may then be opened in the oxide, the Mo, and the n+InGaAs capping layer. A silicon nitride material may then be deposited to form spacers. Then, a gate dielectric may be deposited, a metal may then be deposited, and a CMP step may then be performed. Then, windows may be opened for forming source and drains, the windows may be filled with metal, and then CMP may be performed. This flow is almost the same as for the HEMT except for the nitride (or oxide) spacers and the fact that a dielectric is formed between the gate and the channel in the case of the MOSFET. This means that the metal for the gate and the S/D may not be deposited simultaneously because the dielectric needs to be opened in the S/D regions. In principle, it may also be possible to open the S/D windows in a manner that allows simultaneously filling the S/D and the gate with metal, but this may involve depositing a resist, and the presence of resist material in the gate window may make for a bad gate after filling. Thus, it may be desirable to first fill the gate and then open the S/D windows. After the gate, windows for the source and drain may be opened, and CMP may be performed. Then, the next layer of the metal may be deposited. Again, a T-shaped head may be formed on the top of the gate, and contacts for the source and drain may be formed. Three different metals can be used here—one for the bottom of the gate (vertical bar of the T), one for the S/D, and one for the head of the gate (horizontal bar of the T). An etch stop layer can be present above the S/D and gate metals. Then, an oxide may be deposited, and windows may be opened for contacts. Then, CMP may be performed.

Referring to FIG. 7, compared to the previous MOSFET device of FIG. 6, the spacer 271 and barrier 272 layers are not provided, and the delta doping monolayer 260 is present inside the channel material 250. As was the case for the HEMT devices, the channel material 250 may again be in direct contact with the bonding layer(s) 500. To form this structure, the InAlAs layer which was between the bonding oxide and the channel may be skipped, and a delta doping may be inserted at the bottom of the channel. The onset current flows on the top portion of the layer, so inserting dopants close to the bonding may not greatly impact the mobility because the dopants are restricted to a bottom region, away from the gate dielectric/channel interface. The rest of the process is analogous to the one described for obtaining the structure of FIG. 6.

It is to be understood that although specific constructions, configurations, and materials have been discussed herein for example devices, various changes or modifications in form and detail may be made without departing from the scope and technical teachings of this disclosure. For example, any formulas given above are merely representative of procedures that may be used. Functionality may be added or deleted from the block diagrams, and operations may be interchanged among functional blocks. Steps may be added or deleted to methods described within the scope of the present disclosure.

What is claimed is:

1. A method for forming a semiconductor structure, comprising:
   providing a donor substrate having a trench therein and having a plurality of semiconductor layers epitaxially grown on top of one another on the donor substrate in such a way that at least a first semiconductor layer of the plurality of semiconductor layers is present in the trench, wherein the trench:
   (i) opens toward a top of the donor substrate,
   (ii) is defined by a monocrystalline bottom portion and non-crystalline sidewalls, the monocrystalline bottom portion having a V-shaped vertical cross-section and being defined by two crystalline planes having Miller indices {111}, and
   (iii) comprises a width in the range of 10 nm to 10 µm;
   providing a carrier substrate comprising:
   (i) a semiconductor substrate at a bottom of the carrier substrate,
   (ii) a first semiconductor device on the semiconductor substrate, and
   (iii) electrical contacts to the first semiconductor device at a top of the carrier substrate;
   bonding the donor substrate to the carrier substrate with the top of the donor substrate and the top of the carrier substrate facing each other;
   removing at least part of the donor substrate in such a way as to expose the first semiconductor layer, wherein the first semiconductor layer is grown on the monocrystalline bottom of the trench; and
   removing at least part of the exposed first semiconductor layer, thereby modifying the plurality of semiconductor layers.

2. The method of claim 1, further comprising forming a second semiconductor device from the modified plurality of semiconductor layers.

3. The method of claim 1, wherein the vertical cross-section is taken perpendicularly to a longitudinal direction of the trench.

4. The method of claim 1, wherein at least one semiconductor layer of the plurality of semiconductor layers has a top surface comprising less than $10^8$ threading dislocations per $cm^2$.

5. The method of claim 4, wherein the first semiconductor layer grown on the monocrystalline bottom has a top surface comprising less than $10^8$ threading dislocations per $cm^2$.

6. The method of claim 1, further comprising, before bonding the donor substrate to the carrier substrate, providing a bonding layer on top of the donor substrate, the carrier substrate, or both.

7. The method of claim 6, wherein the bonding layer is a dielectric layer.

8. The method of claim 6, wherein the bonding layer comprises an oxide or a nitride.

9. The method of claim 6, wherein the plurality of semiconductor layers comprises a layer of channel material, and wherein bonding the donor substrate to the carrier substrate forms a bonded structure in which the bonding layer is directly in contact with the layer of channel material.

10. The method of claim 1, wherein a delta doping monolayer is present within at least one semiconductor layer of the plurality of semiconductor layers.

11. The method of claim 10, wherein the delta doping monolayer is located away from a center of the thickness of the layer of channel material.

12. The method of claim 1, wherein the trench has a depth to width aspect ratio smaller than 2:1.

13. The method of claim 2 wherein forming the second semiconductor device from the modified plurality of semiconductor layers comprises patterning the modified plurality of semiconductor layers to form the second semiconductor device.

14. The method of claim 2, wherein the first semiconductor device comprises a complementary metal-oxide-semiconductor device, and wherein the second semiconductor device comprises a radio-frequency device.

15. The method of claim 2, wherein the second semiconductor device comprises a high-electron-mobility transistor.

16. The method of claim 1, wherein, during or after bonding the donor substrate to the carrier substrate, the carrier substrate is kept at temperatures not exceeding 500° C.

17. The method of claim 1, wherein only the first semiconductor layer of the plurality of semiconductor layers is present in the trench, and wherein removing at least part of the exposed first semiconductor layer comprises removing the entire first semiconductor layer.

* * * * *